United States Patent
Jo et al.

(10) Patent No.: US 10,511,048 B2
(45) Date of Patent: Dec. 17, 2019

(54) METHOD OF PREPARING NEGATIVE ELECTRODE ACTIVE MATERIAL FOR LITHIUM SECONDARY BATTERY AND LITHIUM SECONDARY BATTERY USING THE SAME

(71) Applicant: LG CHEM, LTD., Seoul (KR)

(72) Inventors: Rae Hwan Jo, Daejeon (KR); Yong Ju Lee, Daejeon (KR); Eun Kyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 132 days.

(21) Appl. No.: 15/751,916

(22) PCT Filed: Dec. 9, 2016

(86) PCT No.: PCT/KR2016/014452
§ 371 (c)(1),
(2) Date: Feb. 12, 2018

(87) PCT Pub. No.: WO2017/099523
PCT Pub. Date: Jun. 15, 2017

(65) Prior Publication Data
US 2018/0269519 A1 Sep. 20, 2018

(30) Foreign Application Priority Data
Dec. 10, 2015 (KR) .................. 10-2015-0176259

(51) Int. Cl.
*H01M 10/052* (2010.01)
*H01M 4/134* (2010.01)
(Continued)

(52) U.S. Cl.
CPC ......... *H01M 10/052* (2013.01); *C01B 33/021* (2013.01); *C23C 16/24* (2013.01);
(Continued)

(58) Field of Classification Search
CPC ... C01B 33/02; C01B 33/021; C01P 2004/84; C23C 16/24; H01M 10/052;
(Continued)

(56) References Cited

U.S. PATENT DOCUMENTS 9,905,842 B2 * 2/2018 Kim ................. H01M 4/133
2005/0074672 A1 * 4/2005 Matsubara .......... H01M 4/0421
429/231.95

(Continued)

FOREIGN PATENT DOCUMENTS

DE 102005011940 A1 9/2006
KR 10-2012-0018187 A 2/2012
(Continued)

OTHER PUBLICATIONS

International Search Report (PCT/ISA/210) issued in PCT/KR2016/014452, dated Mar. 14, 2017.
(Continued)

*Primary Examiner* — Carlos Barcena
(74) *Attorney, Agent, or Firm* — Birch, Stewart, Kolasch & Birch, LLP

(57) ABSTRACT

The present invention relates to a method of preparing a negative electrode active material for a secondary battery which may prevent oxidation during the preparation of nano-sized silicon particles, a negative electrode active material for a secondary battery prepared thereby, and a negative electrode for a secondary battery and a lithium secondary battery including the same.

18 Claims, 2 Drawing Sheets

(51) Int. Cl.
*H01M 4/133* (2010.01)
*H01M 4/583* (2010.01)
*H01M 4/66* (2006.01)
*H01M 4/70* (2006.01)
*C23C 16/24* (2006.01)
*C01B 33/021* (2006.01)
*H01M 4/02* (2006.01)

(52) U.S. Cl.
CPC .......... *H01M 4/133* (2013.01); *H01M 4/134* (2013.01); *H01M 4/583* (2013.01); *H01M 4/667* (2013.01); *H01M 4/70* (2013.01); *H01M 2004/027* (2013.01); *H01M 2004/028* (2013.01)

(58) Field of Classification Search
CPC ..... H01M 2004/021; H01M 2004/027; H01M 2004/028; H01M 4/133; H01M 4/134; H01M 4/366; H01M 4/386; H01M 4/583; H01M 4/587; H01M 4/667; H01M 4/70
See application file for complete search history.

(56) References Cited

U.S. PATENT DOCUMENTS

| 2008/0145761 | A1 | 6/2008 | Petrat et al. | |
|---|---|---|---|---|
| 2009/0269669 | A1* | 10/2009 | Kim | H01M 4/587 429/231.8 |
| 2011/0281180 | A1* | 11/2011 | Kim | H01M 4/133 429/338 |
| 2012/0122266 | A1 | 5/2012 | Sachs et al. | |
| 2012/0264020 | A1 | 10/2012 | Burton et al. | |
| 2013/0108923 | A1 | 5/2013 | Nakanishi et al. | |
| 2013/0122369 | A1 | 5/2013 | Kim et al. | |
| 2015/0270536 | A1 | 9/2015 | Kawakami et al. | |
| 2017/0338477 | A1 | 11/2017 | Kawakami et al. | |
| 2017/0338478 | A1 | 11/2017 | Kawakami et al. | |

FOREIGN PATENT DOCUMENTS

| KR | 10-2013-0048160 A | 5/2013 |
|---|---|---|
| KR | 10-2013-0052397 A | 5/2013 |
| KR | 10-2014-0070227 A | 6/2014 |
| KR | 10-2014-0094676 A | 7/2014 |
| KR | 10-2015-0086879 A | 7/2015 |
| KR | 10-2015-0109056 A | 10/2015 |

OTHER PUBLICATIONS

Extended European Search Report, dated Sep. 26, 2018, for European Application No. 16873388.9.

* cited by examiner

10

50

100

METHOD OF PREPARING NEGATIVE ELECTRODE ACTIVE MATERIAL FOR LITHIUM SECONDARY BATTERY AND LITHIUM SECONDARY BATTERY USING THE SAME

CROSS-REFERENCE TO RELATED APPLICATIONS

This application claims the benefit of Korean Patent Application Nos. 10-2015-0176259, 10-2015-0176263, and 10-2015-0176265, filed on Dec. 10, 2015, and 10-2016-0166995, filed on Dec. 8, 2016, in the Korean Intellectual Property Office, the disclosure of which is incorporated herein in its entirety by reference.

TECHNICAL FIELD

The present invention relates to a method of preparing a negative electrode active material for a lithium secondary battery and a lithium secondary battery using the same.

BACKGROUND ART

Recently, in line with miniaturization, lightweight, thin profile, and portable trends in electronic devices according to the development of information and telecommunications industry, the need for high energy density batteries used as power sources of such electronic devices has increased.

Lithium secondary batteries, as chargeable batteries that may best meet the need, have been used in portable electronic devices and communication devices, such as small video cameras, mobile phones, and notebooks.

In general, a lithium secondary battery is composed of a positive electrode, a negative electrode, and an electrolyte, in which charge and discharge may be possible because lithium ions, which are discharged from a positive electrode active material by first charging, may act to transfer energy while moving between both electrodes, for example, the lithium ions are intercalated into a negative electrode active material, i.e., carbon particles, and deintercalated during discharging.

Since there is a continuous need for high-capacity batteries due to the development of portable electronic devices, research into high-capacity non-carbon-based negative electrode active materials, which have significantly higher capacity per unit mass than that of carbon that is used as a typical negative electrode active material, has been actively conducted. Among these negative electrode active materials, it has been reported that a silicon-based negative electrode active material is inexpensive and is a high-capacity negative electrode active material having high capacity, for example, discharge capacity (about 4,200 mAh/g) about 10 times that of graphite as a commercial negative electrode active material.

However, since the silicon-based negative electrode active material is an insulator and the degradation of battery performance occurs due to a rapid volume expansion during a charge and discharge process accompanied by various side reactions, for example, crushing of negative electrode active material particles occurs, an unstable solid electrolyte interface (SEI) is formed, or capacity is decreased by electrical contact, this has been a great constraint in the commercialization of the silicon-based negative electrode active material.

Recently, in order to minimize the crushing of the silicon-based negative electrode active material due to charge and discharge, a technique of preparing a nano-sized silicon-based negative electrode active material has been proposed.

However, in order to prepare the nano-sized silicon-based negative electrode active material, a silicon-based material lump is prepared and the lump is then subjected to a nanoscale milling process, wherein, in this case, it may not be easy to control crystallinity of nano-sized silicon-based particles. Also, since the silicon-based negative electrode active material is oxidized during the milling process, there is a limitation in that initial efficiency of a secondary battery is eventually reduced.

Thus, in order to address the above limitation, there is a need to develop a method capable of preventing oxidation during the preparation of the nano-sized silicon-based negative electrode active material.

PRIOR ART DOCUMENT

Korean Patent Application Laid-open Publication No. 10-2015-0109056

Korean Patent Application Laid-open Publication No. 10-2014-0094676

DISCLOSURE OF THE INVENTION

Technical Problem

An aspect of the present invention provides a method of preparing a negative electrode active material for a secondary battery, which may prevent oxidation during the preparation of nano-sized silicon particles.

Another aspect of the present invention provides a negative electrode active material for a secondary battery which is prepared by the above method of preparing a negative electrode active material.

Another aspect of the present invention provides a negative electrode including the negative electrode active material of the present invention.

Another aspect of the present invention provides a lithium secondary battery in which discharge capacity, initial efficiency, and output characteristics are improved by including the negative electrode of the present invention.

Technical Solution

According to an aspect of the present invention, there is provided a method of preparing a negative electrode active material for a lithium secondary battery including the steps of:

depositing an amorphous silicon layer on a surface of a glass substrate by chemical vapor deposition (CVD) using silane ($SiH_4$) gas as a source (S1);

preparing amorphous silicon particles by ultrasonic milling of the amorphous silicon layer (S2);

dispersing the amorphous silicon particles in a carbon-based precursor solution to prepare a dispersion solution (S3);

spray drying the dispersion solution to prepare a silicon-based composite precursor (S4); and heat treating the silicon-based composite precursor to form a silicon composite which includes an amorphous carbon coating layer containing at least one amorphous silicon particle in the inside thereof (S5).

The amorphous silicon layer depositing step S1 may be performed by applying the silane gas at a rate of 10 sccm/60 min to 50 sccm/60 min in a temperature range of 500° C. to 700° C. and in a pressure range of $10^{-8}$ Torr to 760 Torr (1 atm), particularly, $10^{-2}$ Torr to 760 Torr.

In this case, a thickness of the deposited amorphous silicon layer may be in a range of 20 nm to 500 nm.

Also, in the amorphous silicon layer milling step S2, after the glass substrate having the amorphous silicon layer deposited thereon is immersed in an acetone solution, milling may be performed at a power of 50 W to 200 W for 10 minutes to 20 minutes at room temperature using an ultrasonic milling machine.

The method of the present invention may further include collecting the milled amorphous silicon particles by volatilizing an acetone solvent, after the preparing of the amorphous silicon particles.

The milled amorphous silicon particles may have an average particle diameter (D50) of 5 nm to 500 nm.

Also, the dispersion solution preparing step S3 may be performed by mixing a carbon-based material capable of being carbonized at a temperature of 1,000° C. or less with distilled water to prepare a carbon-based precursor solution, and dispersing the amorphous silicon particles.

The carbon-based precursor solution may be used in an amount of 25 parts by weight to 4,000 parts by weight based on 100 parts by weight of the amorphous silicon particles.

Furthermore, in the method of the present invention, at least one conductive carbon-based material selected from the group consisting of crystalline carbon and amorphous carbon may be dispersed together during the dispersing of the amorphous silicon particles.

The conductive carbon-based material may be used in an amount of 0.99 part by weight to 1,900 parts by weight based on 100 parts by weight of the amorphous silicon particles.

Also, the dispersion solution spray-drying step S4 is performed by providing the precursor solution to a sprayer to form droplets by spraying, followed by drying the droplets at the same time.

In this case, the spray drying may be performed at a rate of 10 mL/min to 50 mL/min in a temperature range of about 50° C. to about 300° C.

Furthermore, the silicon-based composite precursor heat treating step S5 may be performed in a temperature range of 400° C. to 1,000° C. for about 10 minutes to about 1 hour.

According to another aspect of the present invention, there is provided a negative electrode active material for a secondary battery, which is prepared by the method of the present invention, including a silicon composite comprising:

an amorphous carbon coating layer; and at least one amorphous silicon particle included in the amorphous carbon coating layer.

The amorphous silicon particle may include a single particle or a secondary amorphous silicon particle which is formed by agglomeration of primary amorphous silicon particles composed of the single particle. The amorphous silicon particles may be uniformly dispersed in the amorphous carbon coating layer.

The amorphous silicon particles may be included in an amount of 1 wt % to 95 wt %, particularly 5 wt % to 90 wt %, based on a total weight of the negative electrode active material.

A weight ratio of the amorphous silicon particles: the amorphous carbon coating layer may be in a range of 1:99 to 95:5, particularly 5:95 to 90:10.

The negative electrode active material may further include at least one conductive carbon-based material selected from the group consisting of crystalline carbon or amorphous carbon which is different from that forming the amorphous carbon coating layer in the amorphous carbon coating layer.

Specifically, the negative electrode active material may include a silicon composite comprising an amorphous carbon coating layer; and at least one amorphous silicon particle and amorphous carbon included in the amorphous carbon coating layer.

Also, the negative electrode active material may include a silicon composite comprising an amorphous carbon coating layer; and at least one amorphous silicon particle and crystalline carbon included in the amorphous carbon coating layer, wherein the at least one amorphous silicon particle is distributed on a surface of the crystalline carbon.

The conductive carbon-based material may be included in an amount of 0.1 wt % to 90 wt % based on the total weight of the negative electrode active material. Specifically, in a case in which the conductive carbon-based material is amorphous carbon, the amorphous carbon may be included in an amount of 0.1 wt % to 50 wt % based on the total weight of the negative electrode active material, and, in a case in which the conductive carbon-based material is crystalline carbon, the crystalline carbon may be included in an amount of 10 wt % to 90 wt % based on the total weight of the negative electrode active material.

According to another aspect of the present invention, there is provided a negative electrode including:

a current collector; and the negative electrode active material prepared by the method of the present invention which is formed on at least one surface of the current collector.

According to another aspect of the present invention, there is provided a lithium secondary battery including the negative electrode.

Advantageous Effects

According to a method of the present invention, oxidation may be prevented during the preparation of silicon nanoparticles, and amorphous silicon particles for a negative electrode active material having controlled crystallinity may be prepared. Also, a negative electrode active material, in which an electrode thickness expansion phenomenon is reduced in comparison to a case of using crystalline silicon particles by including these amorphous silicon particles, and a negative electrode including the negative electrode active material may be prepared. Furthermore, a lithium secondary battery, in which initial efficiency, reversible capacity, and life characteristics are improved by including the above negative electrode, may be prepared.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

Figure 1:
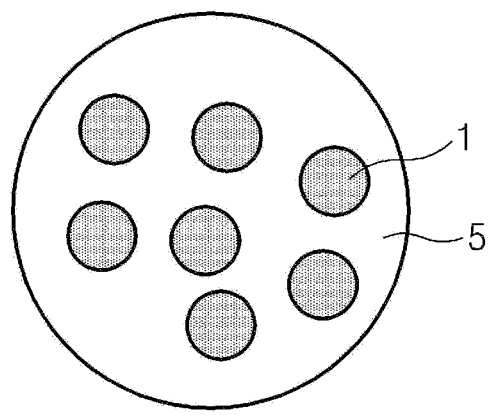
FIG. 1 is a schematic view illustrating a negative electrode active material for a lithium secondary battery including a silicon composite which is prepared in Example 1 of the present invention.

DESCRIPTION OF THE SYMBOLS 1, 11, 111: Amorphous silicon particle
13: Amorphous carbon
5, 15, 115: Amorphous carbon coating layer
10, 50, 100: Negative electrode active material
117: Crystalline carbon

MODE FOR CARRYING OUT THE INVENTION

Hereinafter, the present invention will be described in more detail to allow for a clearer understanding of the present invention.

It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

Recently, a silicon-based negative electrode active material is proposed as a negative electrode active material for a lithium secondary battery, but the silicon-based negative electrode active material is disadvantageous in that battery performance is degraded by the occurrence of crushing of negative electrode active material particles or the formation of an unstable solid electrolyte interface (SEI) due to its non-conducting properties and a rapid volume change during a charge and discharge process. In particular, with respect to a Si/C composite developed to provide high electrical conductivity to silicon, it has a limitation in that brittle carbon is crushed due to volume expansion of silicon occurring during charge and discharge. In order to improve the limitation, a method for preparing nano-sized silicon-based powder is being developed, but, since a silicon-based material is oxidized during a milling process, another limitation may occur in which initial efficiency is reduced.

Thus, the present invention may provide a method of preparing a negative electrode active material which may prepare amorphous silicon particles, in which crystallinity may be easily controlled and oxidation may be prevented during a preparation process, by deposing an amorphous silicon layer and then performing ultrasonic milling. Also, a lithium secondary battery having improved initial efficiency, life characteristics, and electrode thickness expansion characteristics may be prepared by using the amorphous silicon particles as a negative electrode active material.

Specifically, in an embodiment of the present invention, provided is a method of preparing a negative electrode active material for a lithium secondary battery including the steps of:

depositing an amorphous silicon layer on a surface of a glass substrate by chemical vapor deposition (CVD) using silane ($SiH_4$) gas as a source (S1);

preparing amorphous silicon particles by ultrasonic milling of the amorphous silicon layer (S2);

dispersing the amorphous silicon particles in a carbon-based precursor solution to prepare a dispersion solution (S3);

spray drying the dispersion solution to prepare a silicon-based composite precursor (S4); and heat treating the silicon-based composite precursor to form a silicon composite which includes an amorphous carbon coating layer containing at least one amorphous silicon particle in the inside thereof (S5).

In this case, in the method of the present invention, the amorphous silicon layer depositing step S1 may be performed by applying the silane gas at a rate of 10 sccm/60 min to 50 sccm/60 min in a temperature range of 700° C. or less, particularly 500° C. to 700° C., and in a pressure range of $10^{-8}$ Torr to 760 Torr (1 atm), particularly $10^{-2}$ Torr to 760 Torr.

As described above, in the method of the present invention, since the chemical vapor deposition is performed in a temperature range of 500° C. to 700° C., a thin amorphous silicon layer, which is brittle enough to be easily crushed in the ultrasonic milling step to be described later due to weak bonding between silicon atoms, may be deposited. If the silane gas is applied at a temperature of less than 500° C., the amorphous silicon layer may not be deposited. In contrast, if the silane gas is applied at a temperature of greater than 700° C., since crystal growth of the silicon-based particles is increased, a crystalline silicon layer may be formed.

Thus, in the method of the present invention, since the crystal growth of the silicon particles is suppressed by performing the chemical vapor deposition in a low temperature range, an amorphous silicon layer may be formed. With respect to the amorphous silicon layer formed by the chemical vapor deposition of the present invention, it is advantageous in that life characteristics are excellent and volume expansion is small in comparison to the crystalline silicon layer when it is prepared as nanoparticles.

The amorphous silicon layer may be deposited to a thickness of about 20 nm to about 500 nm.

If the deposition thickness of the amorphous silicon layer is less than 20 nm, a particle diameter of the collected silicon particles is very small and a specific surface area is increased when the subsequent ultrasonic milling process is performed, and thus, initial efficiency may be reduced. In contrast, in a case in which the deposition thickness of the amorphous silicon layer is greater than 500 nm, it may be difficult to stably perform the subsequent ultrasonic milling process.

Also, in the amorphous silicon layer milling step S2 in the method of the present invention, after the glass substrate having the amorphous silicon layer deposited thereon is immersed in a beaker containing acetone, ultrasonic milling may be performed at a power of 50 W to 200 W for 10 minutes to 20 minutes at room temperature using an ultrasonic milling machine. In this case, any ultrasonic power and processing time other than those described above may be sufficiently used if the amorphous silicon layer may be milled to nano-sized amorphous silicon particles having a desired size.

An amount of the acetone used is not significantly correlated with a thickness ratio of the silicon layer, but the acetone may be used in an amount such that the glass substrate having the amorphous silicon layer deposited thereon is completely immersed in the acetone.

With respect to the amorphous silicon particles with low crystallinity prepared by the method of the present invention, in a case in which high heat is applied during a drying process after the milling, since the crystallinity of the milled amorphous silicon particles is increased, crystalline silicon particles may be formed. Thus, the drying process may be performed at a temperature as low as possible, and, for this purpose, it is desirable to use a solvent, which is highly volatile even at a low temperature, such as acetone, during an ultrasonic milling process. In this case, in addition to the acetone, an organic solvent, which is highly volatile even at a low temperature, such as ethanol or methanol, may be used.

With respect to a conventional general mechanical milling process, processing time is long and the temperature may be increased due to friction between particles during the milling process. As a result, surrounding oxygen or moisture is reacted with the silicon particles so that oxidation of the silicon particles may occur. However, with respect to the method as in the present invention, since the amorphous silicon layer is deposited and the ultrasonic milling is then performed, the amorphous silicon layer may be milled within a short period of time at a low temperature. In addition, since a process of collecting the ultrasonically milled amorphous silicon particles is simultaneously performed, the growth of silicon grains during the milling process or the oxidation of the silicon particles may be prevented.

Also, the method of the present invention may include collecting the milled amorphous silicon particles by volatilizing the acetone solvent after the completion of the ultrasonic milling process.

The amorphous silicon particles obtained by the method of the present invention may have an average particle diameter (D50) of 5 nm to 500 nm, for example, 20 nm to 200 nm.

In a case in which the average particle diameter of the amorphous silicon particles is less than 5 nm, since the specific surface area is excessively increased, loss of reversible capacity may occur. If the average particle diameter of the amorphous silicon particles is greater than 500 nm, since the volume expansion is increased during a reaction with lithium ions due to the large particle diameter, efficiency in buffering the volume expansion of the entire spherical negative electrode active material is reduced.

That is, a negative electrode active material generally reacts with an electrolyte solution during charging to generate a protective layer called SEI on a particle surface, wherein, theoretically, the SEI is not decomposed well once it is generated. However, the SEI may be broken due to volume change or cracks of the negative electrode active material or due to external heat or impact, and, in this case, the SEI may also be regenerated when the surface of an electrode is exposed to the electrolyte solution. In a case in which the average particle diameter (D50) of the single silicon particle is greater than 500 nm, since cracks repeatedly occur due to charge and discharge, a volume increases while the SEI is repeatedly generated. Thus, the increase in the volume of the silicon particle results in an increase in volume of the final negative electrode active material particle.

Also, in the method of the present invention, the dispersion solution preparing step S3 may be performed by mixing a carbon-based material, which may be carbonized at a temperature of 1,000° C. or less, with distilled water to prepare a carbon-based precursor solution, and then dispersing the amorphous silicon particles.

The carbon-based precursor solution may be prepared by mixing the distilled water and the carbon-based material in a weight ratio of about 1:2 to 10:1.

Typical examples of the carbon-based material, which may be carbonized at a temperature of 1,000° C. or less, may be a single material selected from the group consisting of sucrose, glucose, fructose, galactose, maltose, and lactose, or a mixture of two or more thereof, and, among them, the carbon-based material may include sucrose which may be carbonized at a relatively low temperature.

In the method of the present invention, the carbon-based precursor solution may be used in an amount of 25 parts by weight to 4,000 parts by weight based on 100 parts by weight of the amorphous silicon particles. In a case in which the amount of the carbon-based precursor solution used is less than 25 parts by weight, since viscosity of the amorphous silicon particles/carbon-based precursor solution is high, it is not easy to perform a spraying process. In a case in which the amount of the carbon-based precursor solution used is greater than 4,000 parts by weight, since the amount of the amorphous silicon particles in the dispersion solution is very small, its role as a high capacity negative electrode material may be reduced.

Furthermore, in the method of the present invention, when the dispersion solution is prepared by dispersing the amorphous silicon particles, at least one conductive carbon-based material selected from the group consisting of crystalline carbon and amorphous carbon may be dispersed together. In this case, the amorphous carbon may be a different material from the amorphous carbon layer forming material as described above.

That is, the negative electrode active material of the present invention may further include a conductive carbon-based material to compensate for low conductivity of the silicon particles or achieve the role of a structural support when it is formed into a secondary particle.

The conductive carbon-based material may be dispersed in an amount of 0.99 part by weight to 1,900 parts by weight based on 100 parts by weight of the amorphous silicon particles.

In a case in which the amount of the conductive carbon-based material is less than 0.99 part by weight, the conductive carbon-based material does not improve the conductivity or does not play a role in the structural support. In a case in which the amount of the conductive carbon-based material is greater than 1,900 parts by weight, since the amount of the silicon-based active material is reduced to reduce discharge capacity per weight (mAh/g), there is no benefit in terms of discharge capacity of the final active material.

The conductive carbon-based material is not particularly limited as long as it is crystalline or amorphous carbon having conductivity without causing adverse chemical changes in the battery. Specifically, the crystalline carbon may include natural graphite, artificial graphite, or graphene, and the amorphous carbon may include a single material selected from the group consisting of hard carbon, soft carbon, carbon black, acetylene black, Ketjen black, channel black, furnace black, lamp black, thermal black, and carbon nanofibers, or a mixture of two or more thereof.

In this case, an average particle diameter (D50) of natural graphite or artificial graphite particles, as the crystalline carbon, may be in a range of 300 nm to 30 μm. In a case in which the average particle diameter of the natural or artificial graphite particles is less than 300 nm, the role of the structural support may be reduced. In a case in which the average particle diameter of the natural or artificial graphite particles is greater than 30 μm, since an average particle diameter of the final negative electrode active material is increased, a coating process may be difficult during the preparation of the lithium secondary battery.

In addition to the above conductive carbon-based material, the negative electrode active material of the present invention may further include a single material selected from the group consisting of metal fibers, metal powder, zinc oxide, potassium titanate, titanium oxide, and polyphenylene derivatives, or a conductive material of two or more thereof.

Also, the spray-drying step S4 for preparing a silicon-based composite precursor in the method of the present invention is performed by providing the precursor solution to a sprayer to form droplets by spraying, followed by drying the droplets at the same time.

The spraying may be performed at a rate of 10 mL/min to 50 mL/min in a temperature range of about 50° C. to about 300° C., for example, 80° C. to 250° C. by using a drying method including rotary spraying, nozzle spraying, and ultrasonic spraying, or a combination thereof.

In this case, in a case in which the spray drying is performed within the above temperature and rate ranges, the formation of the droplets of the solution and the drying may be stably performed.

Figure 2:
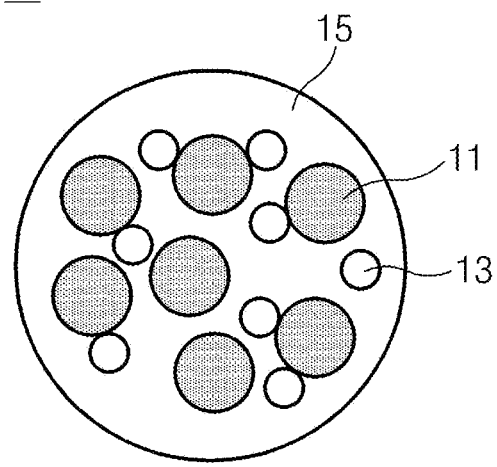
FIG. 2 is a schematic view illustrating a negative electrode active material for a lithium secondary battery including a silicon composite which is prepared in Example 2 of the present invention.
Figure 3:
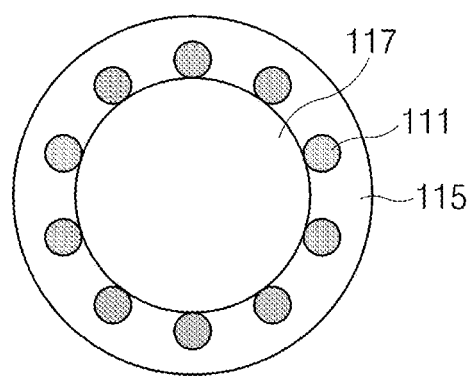
FIG. 3 is a schematic view illustrating a negative electrode active material for a lithium secondary battery including a silicon composite which is prepared in Example 3 of the present invention.

The average particle diameter (D50) of the amorphous silicon particles included in the present invention is in a range of 5 nm to 500 nm, an average particle diameter (D50) of amorphous carbon particles is in a range of about 100 nm to about 300 nm, and an average particle diameter (D50) of crystalline carbon particles is in a range of 300 nm or more, for example, a few µm to 30 µm. Thus, in a case in which the amorphous silicon particles and the amorphous carbon particles are composited by spraying them together in the spraying step, since there is no big difference between the average particle diameters of the two kinds of particles, the negative electrode active material is prepared in a form in which the amorphous silicon particles and the amorphous carbon particles are uniformly distributed in the final active material as illustrated in FIG. 2. In contrast, in a case in which the amorphous silicon particles and the crystalline carbon particles are composited by dispersing them together in the spraying step, due to a difference in the average particle diameters of the two kinds of particles, that is, since the average particle diameter of the crystalline carbon particles is larger than the average particle diameter of the amorphous silicon particles, the negative electrode active material may be prepared in a form in which the surface of the crystalline carbon seems to be coated with the amorphous silicon particles as illustrated in FIG. 3.

Furthermore, in the method of the present invention, the silicon-based composite precursor heat treating step S5 may be performed in a temperature range of 400° C. to 1,000° C., for example, 500° C. to 800° C. for about 10 minutes to about 1 hour, for example, 20 minutes to 1 hour.

In a case in which the heat treatment temperature is less than 400° C., since the temperature is excessively low, a carbonization process does not sufficiently occur, and thus, it is difficult to form the amorphous carbon coating layer. In a case in which the heat treatment temperature is greater than 1,000° C., since the temperature is excessively high, crystallinity of the amorphous carbon coating layer included in the precursor may be increased.

The heat treating may be performed in an inert atmosphere in which nitrogen gas, argon gas, helium gas, krypton gas, or xenon gas is present.

Also, in an embodiment of the present invention, provided is a negative electrode active material 10 for a lithium secondary battery, as the negative electrode active material for a lithium secondary battery prepared by the method of the present invention, including a silicon composite comprising:

an amorphous carbon coating layer 5; and at least one amorphous silicon particle 1 included in the amorphous carbon coating layer 5 (see FIG. 1).

In this case, the amorphous silicon particle included in the amorphous carbon coating layer may include the single particle or a secondary amorphous silicon particle which is formed by the agglomeration of primary amorphous silicon particles composed of the single particle. The amorphous silicon particles may be uniformly dispersed in the amorphous carbon coating layer.

Specifically, an average particle diameter of the amorphous silicon particles may be in a range of 5 nm to 500 nm, for example, 20 nm to 200 nm. The amorphous silicon particles may be included in an amount of 1 wt % to 95 wt %, for example, 5 wt % to 90 wt % based on a total weight of the negative electrode active material.

Also, a weight ratio of the at least one amorphous silicon particle: the amorphous carbon coating layer may be in a range of 5:90 to 90:10, for example, 10:90 to 80:20.

Furthermore, the negative electrode active material may further include at least one conductive carbon-based material selected from the group consisting of crystalline carbon or amorphous carbon which is different from that forming the amorphous carbon coating layer in the amorphous carbon coating layer.

The conductive carbon-based material may be included in an amount of 0.1 wt % to 90 wt % based on the total weight of the negative electrode active material.

Specifically, in an embodiment of the present invention, provided is a negative electrode active material 50 for a lithium secondary battery, as the negative electrode active material for a lithium secondary battery prepared by the method of the present invention, including a silicon composite comprising:

an amorphous carbon coating layer 15; and at least one amorphous silicon particle 11 and amorphous carbon 13 included in the amorphous carbon coating layer (see FIG. 2).

The amorphous carbon may be included in an amount of 0.1 wt % to 50 wt % based on the total weight of the negative electrode active material. In a case in which the amount of the amorphous carbon is less than 0.1 wt %, it is difficult to expect an electrical conductivity improvement effect due to the addition of the conductive carbon-based material, and, in a case in which the amount of the amorphous carbon is greater than 50 wt %, reversible capacity of the final negative electrode active material may be reduced.

Also, in an embodiment of the present invention, provided is a negative electrode active material 100 for a lithium secondary battery, as the negative electrode active material for a lithium secondary battery prepared by the method of the present invention, including a silicon composite comprising:

an amorphous carbon coating layer 115; and at least one amorphous silicon particle 111 and crystalline carbon 117 included in the amorphous carbon coating layer, wherein the at least one amorphous silicon particle 111 is distributed on the crystalline carbon 117 (see FIG. 3).

The crystalline carbon may include spherical/plate-shaped natural graphite or artificial graphite.

The crystalline carbon has an average particle diameter (D50) of 300 nm to 30 µm.

In a case in which the average particle diameter of the crystalline carbon is less than 300 nm, the role of the structural support may be reduced. In case in which the average particle diameter of the crystalline carbon is greater than 30 µm, since the average particle diameter of the final negative electrode active material is increased, it may be difficult to perform a uniform coating process during the preparation of the secondary battery.

The crystalline carbon may be included in an amount of 10 wt % to 90 wt % based on the total weight of the negative electrode active material. In a case in which the amount of the crystalline carbon is less than 10 wt %, it is difficult to expect the role of the structural support and the electrical conductivity improvement effect due to the addition of the crystalline carbon, and, in a case in which the amount of the crystalline carbon is greater than 90 wt %, the reversible capacity of the final negative electrode active material may be reduced.

Furthermore, the negative electrode active material of the present invention has an average particle diameter (D50) of 50 nm to 35 μm.

Specifically, in a case in which the negative electrode active material of the present invention includes amorphous silicon particles, or amorphous silicon particles and amorphous carbon (see FIGS. 1 and 2), the negative electrode active material has an average particle diameter (D50) of 50 nm to 30 μm, and, in a case in which the negative electrode active material of the present invention includes amorphous silicon particles and crystalline carbon (see FIG. 3), the negative electrode active material has an average particle diameter (D50) of 500 nm to 35 μm.

In a case in which the average particle diameter of the negative electrode active material is within the above range, stress in silicon caused by the volume expansion occurring during the charge and discharge of the negative electrode active material may be reduced, the reversible capacity may be increased, and cycle life characteristics may be improved by suppressing the volume expansion during the reaction with lithium. In a case in which the average particle diameter of the negative electrode active material is less than 50 nm, since a specific surface area is excessively increased, loss of the reversible capacity may occur. In a case in which the average particle diameter of the negative electrode active material is greater than 35 μm, since cracks and fracture of the negative electrode active material itself is facilitated due to the stress caused by the volume expansion and the volume expansion during the reaction with lithium is severe due to the large particle diameter, the entire spherical particles become less efficient in buffering the volume expansion.

Also, the negative electrode active material may have a specific surface area (Brunauer-Emmett-Teller (BET)) of 0.5 $m^2/g$ to 20 $m^2/g$. In this case, if the specific surface area is greater than 20 $m^2/g$, since lithium ions are consumed due to an irreversible reaction of the electrolyte solution and the lithium ions on the surface of the active material during the charge and discharge, it may be a cause of initial efficiency reduction.

As described above, with respect to the negative electrode active material comprising the composite including the amorphous silicon particle-amorphous carbon coating layer which is prepared by the method of the present invention, since an overall process temperature is low, the crystal growth and oxidation of the silicon particles may be prevented, and thus, life characteristics and volume expansion characteristics may be excellent in comparison to a conventional crystalline silicon-based nanoparticle-carbon composite and initial efficiency may be excellent in comparison to a typical crystalline silicon-based nanoparticle-carbon composite. Also, since the oxidation of the silicon-based active material during the milling process is prevented, the initial efficiency may be excellent in comparison to the typical crystalline silicon-based nanoparticle-carbon composite, and the discharge capacity (mAh/g) may be large in comparison to the conventional crystalline silicon-based nanoparticle-carbon composite. Particularly, in a case in which graphite is used as a conventional negative electrode active material, discharge capacity of the graphite itself is not large, at 360 mAh/g, in comparison to silicon, and, if the amount of the silicon composited to increase the discharge capacity is increased, silicon particles may be concentrated on a surface portion of the graphite to cause degradation of the life characteristics.

However, with respect to the composite prepared by the method of the present invention, since the silicon particles are uniformly distributed in the carbon matrix, the degradation of the life characteristics may be prevented.

Furthermore, since the negative electrode active material prepared in the method of the present invention further includes a conductive material, such as graphite particles or a conductive agent, in the inside thereof, the conductivity improvement effect may be further achieved.

Also, in the method of the present invention, provided is a negative electrode including:

a current collector; and the negative electrode active material of the present invention formed on at least one surface of the current collector.

In this case, the negative electrode according to an embodiment of the present invention may be prepared by a typical method known in the art. For example, a solvent and, if necessary, a binder as well as a conductive agent are selectively mixed with the negative electrode active material and stirred to prepare a slurry, and a metallic current collector is then coated with the slurry and pressed. Thereafter, the negative electrode may be prepared by drying the coated collector.

According to an embodiment of the present invention, the binder is used to maintain a molded article by binding negative electrode active material particles, wherein a binder, such as polytetrafluoroethylene (PTFE), polyvinylidene fluoride (PVdF), and a styrene-butadiene rubber (SBR), is used.

According to an embodiment of the present invention, the conductive agent may include one selected from the group consisting of natural graphite, artificial graphite, carbon black, acetylene black, Ketjen black, channel black, furnace black, lamp black, thermal black, carbon nanotubes, fullerene, carbon fibers, metal fibers, fluorocarbon, aluminum, nickel powder, zinc oxide, potassium titanate, titanium oxide, and polyphenylene derivatives, or a mixture of two or more thereof, and, for example, the conductive agent may be carbon black.

In an embodiment of the present invention, the negative electrode collector is not particularly limited as long as it has high conductivity without causing adverse chemical changes in the battery, and, for example, copper, stainless steel, aluminum, nickel, titanium, fired carbon, copper or stainless steel that is surface-treated with one of carbon, nickel, titanium, silver, or the like, and an aluminum-cadmium alloy may be used. Also, the negative electrode collector may typically have a thickness of 3 μm to 500 μm, and, similar to the positive electrode collector, microscopic irregularities may be formed on the surface of the collector to improve the adhesion of the negative electrode active material. The negative electrode collector, for example, may be used in various shapes such as that of a film, a sheet, a foil, a net, a porous body, a foam body, a non-woven fabric body, and the like.

Furthermore, in an embodiment of the present invention, using the above negative electrode, provided is a lithium secondary battery including:

a positive electrode, the negative electrode, a separator disposed between the positive electrode and the negative electrode, and a non-aqueous electrolyte solution in which a lithium salt is dissolved.

In this case, in the lithium secondary battery of the present invention, materials commonly used in the art may be used as the positive electrode and electrolyte used, but the present invention is not limited thereto.

Specifically, the positive electrode may be prepared by coating a positive electrode collector with a positive electrode slurry including a positive electrode active material, a binder, a conductive agent, and a solvent, and then drying and rolling the coated positive electrode collector.

The positive electrode active material is a compound capable of reversibly intercalating and deintercalating lithium, wherein the positive electrode active material may specifically include a lithium composite metal oxide including lithium and at least one metal such as cobalt, manganese, nickel, or aluminum. Specifically, the lithium composite metal oxide may include lithium-manganese-based oxide (e.g., $LiMnO_2$, $LiMn_2O_4$, etc.), lithium-cobalt-based oxide (e.g., $LiCoO_2$, etc.), lithium-nickel-based oxide (e.g., $LiNiO_2$, etc.), lithium-nickel-manganese-based oxide (e.g., $LiNi_{1-Y}Mn_YO_2$ (where $0<Y<1$), $LiMn_{2-Z}Ni_ZO_4$ (where $0<Z<2$), etc.), lithium-nickel-cobalt-based oxide (e.g., $LiNi_{1-Y1}Co_{Y1}O_2$ (where $0<Y1<1$), lithium-manganese-cobalt-based oxide (e.g., $LiCo_{1-Y2}Mn_{Y2}O_2$ (where $0<Y2<1$), $LiMn_{2-Z1}Co_{Z1}O_4$ (where $0<z1<2$), etc.), lithium-nickel-manganese-cobalt-based oxide (e.g., $Li(Ni_pCo_qMn_{r1})O_2$ (where $0<p<1$, $0<q<1$, $0<r1<1$, and $p+q+r1=1$) or $Li(Ni_{p1}Co_{q1}Mn_{r2})O_4$ (where $0<p1<2$, $0<q1<2$, $0<r2<2$, and $p1+q1+r2=2$), etc.), or lithium-nickel-cobalt-transition metal (M) oxide (e.g., $Li(Ni_{p2}Co_{q2}Mn_{r3}M_{S2})O_2$ (where M is selected from the group consisting of aluminum (Al), iron (Fe), vanadium (V), chromium (Cr), titanium (Ti), tantalum (Ta), magnesium (Mg), and molybdenum (Mo), and p2, q2, r3, and s2 are atomic fractions of each independent elements, wherein $0<p2<1$, $0<q2<1$, $0<r3<1$, $O<S2<1$, and $p2+q2+r3+S2=1$), etc.), and any one thereof or a compound of two or more thereof may be included. Among these materials, in terms of the improvement of the capacity characteristics and stability of the battery, the lithium composite metal oxide may include $LiCoO_2$, $LiMnO_2$, $LiNiO_2$, lithium nickel manganese cobalt oxide (e.g., $Li(Ni_{0.6}Mn_{0.2}Co_{0.2})O_2$, $Li(Ni_{0.5}Mn_{0.3}Co_{0.2})O_2$, or $Li(Ni_{0.8}Mn_{0.1}CO_{0.1})O_2$), or lithium nickel cobalt aluminum oxide (e.g., $LiNi_{0.8}Co_{0.15}Al_{0.05}O_2$, etc.). In consideration of a significant improvement due to the control of type and content ratio of elements constituting the lithium composite metal oxide, the lithium composite metal oxide may include $Li(Ni_{0.6}Mn_{0.2}Co_{0.2})O_2$, $Li(Ni_{0.5}Mn_{0.3}CO_{0.2})O_2$, $Li(Ni_{0.7}Mn_{0.15}CO_{0.15})O_2$, or $Li(Ni_{0.8}Mn_{0.1}Co_{0.1})O_2$, and any one thereof or a mixture of two or more thereof may be used.

The positive electrode active material may be included in an amount of 80 wt % to 99 wt % based on a total weight of the positive electrode slurry.

The conductive agent is commonly added in an amount of 1 wt % to 30 wt % based on the total weight of the positive electrode slurry. Any conductive agent may be used without particular limitation so long as it has suitable conductivity without causing adverse chemical changes in the battery, and, for example, a conductive material such as: graphite; a carbon-based material such as carbon black, acetylene black, Ketjen black, channel black, furnace black, lamp black, and thermal black; conductive fibers such as carbon fibers or metal fibers; metal powder such as fluorocarbon powder, aluminum powder, and nickel powder; conductive whiskers such as zinc oxide whiskers and potassium titanate whiskers; conductive metal oxide such as titanium oxide; or polyphenylene derivatives may be used. Specific examples of a commercial conductive agent may include acetylene black-based products (Chevron Chemical Company, Denka black (Denka Singapore Private Limited), or Gulf Oil Company), Ketjen black, ethylene carbonate (EC)-based products (Armak Company), Vulcan XC-72 (Cabot Company), and Super P (Timcal Graphite & Carbon).

The binder is a component that assists in the binding between the active material and the conductive agent and in the binding with the current collector, wherein the binder is commonly added in an amount of 1 wt % to 30 wt % based on the total weight of the positive electrode slurry. Examples of the binder may be polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, an ethylene-propylene-diene terpolymer (EPDM), a sulfonated EPDM, a styrene-butadiene rubber, a fluoro rubber, various copolymers, and the like.

The solvent may include an organic solvent, such as N-methyl-2-pyrrolidone (NMP), and may be used in an amount such that desirable viscosity is obtained when the positive electrode active material as well as selectively the binder and the conductive agent is included. For example, the solvent may be included so that a concentration of solid content including the positive electrode active material as well as selectively the binder and the conductive agent is in a range of 50 wt % to 95 wt %, for example, 70 wt % to 90 wt %.

The electrolyte solution includes a non-aqueous organic solvent and a lithium salt which are commonly used during the preparation of the lithium secondary battery.

The non-aqueous organic solvent is not particularly limited as long as it may minimize decomposition due to the oxidation reaction during the charge and discharge of the battery and may exhibit desired characteristics with an additive, and, as a typical example, a carbonate-based compound or a propionate-based compound is used alone or in a mixture of two or more thereof.

Typical examples of the carbonate-based compound may be one selected from the group consisting of dimethyl carbonate (DMC), diethyl carbonate (DEC), dipropyl carbonate (DPC), methylpropyl carbonate (MPC), ethylpropyl carbonate (EPC), methylethyl carbonate (MEC), ethylene carbonate (EC), propylene carbonate (PC), butylene carbonate (BC), and vinylene carbonate (VC), or a mixture of two or more thereof.

Also, typical examples of the propionate-based compound may be one selected from the group consisting of ethyl propionate (EP), propyl propionate (PP), n-propyl propionate, isopropyl propionate, n-butyl propionate, isobutyl propionate, and tert-butyl propionate, or a mixture of two or more thereof.

In addition, as the non-aqueous organic solvent, for example, N-methyl-2-pyrrolidone, propylene carbonate, ethylene carbonate, butylene carbonate, dimethyl carbonate, diethyl carbonate, γ-butyrolactone, 1,2-dimethoxy ethane, 2-methyl tetrahydrofuran, dimethyl sulfoxide, 1,3-dioxolane, formamide, dimethylformamide, dioxolane, acetonitrile, nitromethane, methyl formate, methyl acetate, phosphate triester, trimethoxy methane, a dioxolane derivative, sulfolane, methyl sulfolane, 1,3-dimethyl-2-imidazolidinone, a propylene carbonate derivative, a tetrahydrofuran derivative, ether, methyl propionate, or ethyl propionate may be used.

Also, the lithium salt may include $Li^+$ as a cation, and may include at least one selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(F_2SO_2)_2N^-$, $CF_3CF_2(CF_3)_2CO^-$, $(CF_3SO_2)_2CH^-$, $CF_3$, $(CF_2)_7SO_3^-$, $CF_3CO_2^-$, $CH_3CO_2^-$, $SCN^-$, and $(CF_3CF_2SO_2)_2N^-$, as an anion. The lithium salt may be used alone or in a mixture of two or more thereof, if necessary. An amount of the lithium salt may be appropriately changed within a typical usable range, but, in order to obtain an optimal effect of forming an anti-corrosion film on the surface of the electrode, the lithium salt may be included in a concentration of 0.8 M to 1.5 M in the electrolyte solution.

The lithium secondary battery according to an embodiment of the present invention may include all types of typical lithium secondary batteries such as a lithium metal secondary battery, a lithium ion secondary battery, a lithium polymer secondary battery, or a lithium ion polymer secondary battery.

Also, a shape of the lithium secondary battery of the present invention is not particularly limited, but a cylindrical type using a can, a prismatic type, a pouch type, or a coin type may be used.

The lithium secondary battery of the present invention may be used as power sources of various electronic products. For example, the lithium secondary battery of the present invention may be used in portable phones, mobile phones, game consoles, portable televisions, notebook computers, and calculators, but the present invention is not limited thereto.

Hereinafter, the present invention will be described in detail, according to specific examples. The invention may, however, be embodied in many different forms and should not be construed as being limited to the embodiments set forth herein. Rather, these example embodiments are provided so that this description will be thorough and complete, and will fully convey the scope of the present invention to those skilled in the art.

EXAMPLES

<Preparation of Negative Electrode Active Material>

Example 1

A 100 nm thick amorphous silicon layer was deposited on a surface of a glass substrate by applying silane gas at a rate of 25 sccm/60 min at a temperature of 500° C. and a pressure of 760 Torr.

Subsequently, after the glass substrate having the amorphous silicon layer deposited thereon was immersed in a beaker containing acetone, ultrasonic milling was performed at a power of 100 W for 10 minutes at room temperature using an ultrasonic milling machine to prepare amorphous silicon particles having an average particle diameter (D50) of 100 nm. Thereafter, milled amorphous silicon particles were collected by volatilizing the acetone in a convention oven at 60° C.

Next, a carbon-based precursor solution was prepared by dissolving 120 g of sucrose in 1 L of distilled water, and g of the milled amorphous silicon particles was then dispersed therein to prepare a dispersion solution.

The dispersion solution was spray-dried at a rate of mL/min at 220° C. to prepare a silicon-based composite precursor.

Next, the silicon-based composite precursor was heat-treated at 600° C. for 15 minutes to prepare a negative electrode active material 10 for a lithium secondary battery having an average particle diameter (D50) of 5 μm which included amorphous silicon particles 1 (50 wt %) in an amorphous carbon coating layer 5 (50 wt %) (see FIG. 1).

Example 2

A negative electrode active material 50 for a lithium secondary battery having an average particle diameter (D50) of 5 μm, which included amorphous silicon particles 11 (49 wt %) and a conductive agent 13 (2 wt %) in an amorphous carbon coating layer 15 (49 wt %) (see FIG. 2), was prepared in the same manner as in Example 1 except that a dispersion solution was prepared by dispersing 2 g of carbon black, as amorphous carbon, together when the milled amorphous silicon particles were dispersed in the carbon-based precursor solution in Example 1.

Example 3

A negative electrode active material 100 for a lithium secondary battery having an average particle diameter (D50) of 21 μm, which included amorphous silicon particles 111 (17 wt %) and a graphite particle core 117 (66 wt %) in an amorphous carbon coating layer 115 (17 wt %), was prepared in the same manner as in Example 1 except that a dispersion solution was prepared by dispersing 200 g of artificial graphite particles, as crystalline carbon, together when the milled amorphous silicon particles were dispersed in the carbon-based precursor solution in Example 1.

Comparative Example 1

Silicon powder (Sigma-Aldrich Co.) having an average particle diameter of 44 μm, as a commercial product, was milled by ball milling to prepare nano-sized crystalline silicon particles. In this case, zirconia balls having a diameter of 3 mm were used as milling media, the balls and the silicon powder were mixed in a weight ratio of 1:1, and the milling was performed for 2 hours. After the milling, an average particle diameter of the crystalline silicon particles was 150 nm.

Subsequently, a carbon-based precursor solution was prepared by dissolving 120 g of sucrose in 1 L of distilled water, and 50 g of the milled crystalline silicon particles was then dispersed therein to prepare a dispersion solution.

The dispersion solution was spray-dried at a rate of 20 mL/min at 220° C. to prepare a silicon-based composite precursor.

Next, the silicon-based composite precursor was heat-treated at 600° C. for 15 minutes to prepare a negative electrode active material for a lithium secondary battery having an average particle diameter (D50) of 5 μm which included amorphous silicon particles (50 wt %) in an amorphous carbon coating layer (50 wt %).

Comparative Example 2

A negative electrode active material for a lithium secondary battery having an average particle diameter (D50) of 5 μm, which included amorphous silicon particles (49 wt %) and carbon black (2 wt %) in an amorphous carbon coating layer (49 wt %), was prepared in the same manner as in Comparative Example 1 except that a dispersion solution was prepared by dispersing 2 g of carbon black together when the milled crystalline silicon particles were dispersed in the carbon-based precursor solution in Comparative Example 1.

Comparative Example 3

A negative electrode active material for a lithium secondary battery having an average particle diameter (D50) of 21 µm, which included amorphous silicon particles (17 wt %) and graphite particles (66 wt %) in an amorphous carbon coating layer (17 wt %), was prepared in the same manner as in Comparative Example 1 except that a dispersion solution was prepared by dispersing 200 g of graphite particles together when the milled crystalline silicon particles were dispersed in the carbon-based precursor solution in Comparative Example 1.

<Preparation of Lithium Secondary Battery>

Example 4

(Negative Electrode Preparation)

The negative electrode active material prepared in Example 1 as a negative electrode active material, acetylene black as a conductive agent, a styrene-butadiene rubber (SBR) as a binder, and carboxymethylcellulose (CMC), as a thickener, were mixed at a weight ratio of 96:1:2:1, and the mixture was mixed with water ($H_2O$), as a solvent, to prepare a uniform negative electrode active material slurry.

One surface of a copper current collector was coated with the above-prepared negative electrode active material slurry to a thickness of 65 µm, dried, rolled, and then punched into a predetermined size to prepare a negative electrode.

(Preparation of Lithium Secondary Battery)

A lithium metal foil was used as a counter electrode with respect to the negative electrode.

A polyolefin separator was disposed between the negative electrode and the lithium metal foil, and a coin-type lithium secondary battery was prepared by injecting an electrolyte in which 1 M $LiPF_6$ was dissolved in a solvent prepared by mixing ethylene carbonate (EC) and diethyl carbonate (DEC) at a volume ratio of 30:70.

Example 5

A lithium secondary battery was prepared in the same manner as in Example 4 except that the negative electrode active material prepared in Example 2 was used as a negative electrode active material instead of the negative electrode active material prepared in Example 1.

Example 6

A lithium secondary battery was prepared in the same manner as in Example 4 except that the negative electrode active material prepared in Example 3 was used as a negative electrode active material instead of the negative electrode active material prepared in Example 1.

Comparative Example 4

A lithium secondary battery was prepared in the same manner as in Example 4 except that the negative electrode active material prepared in Comparative Example 1 was used as a negative electrode active material.

Comparative Example 5

A lithium secondary battery was prepared in the same manner as in Comparative Example 4 except that the negative electrode active material prepared in Comparative Example 2 was used as a negative electrode active material.

Comparative Example 6

A lithium secondary battery was prepared in the same manner as in Comparative Example 4 except that the negative electrode active material prepared in Comparative Example 3 was used as a negative electrode active material.

Experimental Examples

Experimental Example 1: Measurement of Physical Properties of Negative Electrode Active Material Oxygen analysis on the negative electrode active materials prepared in Examples 1 to 3 and Comparative Examples 1 to 3 was performed using a CS-800 analyzer by ELTRA GmbH, and specific surface area measurement was performed using BELSORP-max by BEL JAPAN Inc. Also, sizes of silica grains present in the negative electrode active materials of Examples 1 to 3 and sizes of silica grains present in the negative electrode active materials of Comparative Examples 1 to 3 were measured through a D4 Endeavor XRD system by Bruker Corporation. The results thereof are presented in Table 1.

TABLE 1

| | Negative electrode active material (wt %) | | | | | | |
|---|---|---|---|---|---|---|---|
| | Amorphous carbon coating layer | Amorphous silicon particles | Conductive carbon-based material | Average particle diameter (D50) | Oxygen analysis (wt %) | Specific surface area ($m^2/g$) | Silicon grain diameter (nm) |
| Example 1 | 50 | 50 | — | 5 µm | <1 | 5.7 | 4.1 |
| Example 2 | 49 | 49 | 2 | 5 µm | <1 | 5.1 | 4.0 |
| Example 3 | 17 | 17 | 66 | 21 µm | <1 | 2.9 | 4.3 |
| Comparative Example 1 | 50 | 50 | — | 5 µm | 11 | 5.1 | 18.2 |
| Comparative Example 2 | 49 | 49 | 2 | 5 µm | 10 | 5.3 | 17.9 |
| Comparative Example 3 | 17 | 17 | 66 | 21 µm | 5 | 3.1 | 17.9 |

As illustrated in Table 1, oxygen was not detected in the negative electrode active materials of Examples 1 to 3 including the amorphous silicon particles which were prepared by ultrasonic milling, but about 5% or more of oxygen element was detected in the negative electrode active materials of Comparative Examples 1 to 3 including the silicon particles which were milled by ball milling of the bulk silicon powder.

It is known that, in a case in which a size of silicon grains included in a negative electrode active material is small, an electrode volume expansion rate is low. In this case, with respect to the negative electrode active materials of Comparative Examples 1 to 3 including the silicon particles which were milled by the ball milling of the bulk silicon powder as a commercial product, the negative electrode active materials included silicon grains having a diameter of about 17 nm to about 19 nm even after the milling depending on the diameter of the silicon grains included in the bulk silicon powder as illustrated in Table 1. In contrast, the negative electrode active materials of Examples 1 to 3 including the amorphous silicon particles, which were prepared by ultrasonic milling, included silicon grains having a diameter of 4.3 nm or less which was significantly lower than those of the negative electrode active materials of Comparative Examples 1 to 3. Thus, with respect to the electrodes including the negative electrode active materials of Examples 1 to 3 of the present invention, it may be predicted that the volume expansion rate will be reduced.

Experimental Example 2: Measurement of Initial Efficiency and Charge and Discharge Capacity of Lithium Secondary Battery The lithium secondary batteries (coin-type half cells) prepared in Examples 4 to 6 and Comparative Examples 4 to 6 were charged at a constant current (CC) of 0.1 C to a voltage of 5 mV under constant current/constant voltage (CC/CV) conditions and then charged at a constant voltage (CV) until the current reached 0.005 C to measure charge capacities in the first cycle. Thereafter, after the lithium secondary batteries were left standing for 20 minutes, the lithium secondary batteries were subsequently discharged at a constant current of 0.1 C to a voltage of 1.5 V to measure initial efficiencies and discharge capacities. Charge and discharge results of the lithium secondary batteries of Examples 4 to 6 and Comparative Examples 4 to 6 are presented in Table 2 below.

TABLE 2

|  | Initial efficiency (%) | Charge and discharge capacity (mAh/g) |
| --- | --- | --- |
| Example 4 | 85 | 1621 |
| Example 5 | 85 | 1576 |
| Example 6 | 90 | 768 |
| Comparative Example 4 | 75 | 1412 |
| Comparative Example 5 | 76 | 1389 |
| Comparative Example 6 | 81 | 687 |

As illustrated in Table 2, initial efficiency and discharge capacity of the secondary battery of Example 4 were respectively increased by 10% and about 210 mAh/g in comparison to those of the secondary battery of Comparative Example 4. Also, initial efficiency and discharge capacity of the secondary battery of Example 5 were respectively increased by 9% and about 210 mAh/g in comparison to those of the secondary battery of Comparative Example 5. Furthermore, initial efficiency and discharge capacity of the secondary battery of Example 6 were respectively increased by 9% and about 80 mAh/g in comparison to those of the secondary battery of Comparative Example 6.

That is, since oxidation occurred in the negative electrode active materials of Comparative Examples 1 to 3 including the silicon particles, which were prepared by the milling of the bulk silicon powder, due to frictional heat during the milling process and an irreversible phase (phase formed by an irreversible reaction in which the phase is generated during charge, but the phase is not decomposed again during discharge) was formed during initial charge while oxygen was bonded to the silicon particles, the initial efficiency was not only reduced, but the amount of silicon atoms, which may participate in a reversible reaction, was also reduced. Thus, as illustrated in Table 2, charge and discharge reversible capacities of the secondary batteries of Comparative Examples 4 to 6 including the negative electrode active materials of Comparative Examples 1 to 3 were reduced.

With respect to the secondary battery of Example 6, since the amount of the amorphous silicon particles 111 in the negative electrode active material is lower than those of the secondary batteries of Comparative Examples 4 and 5, it may be understood that charge and discharge capacity was relatively reduced.

Experimental Example 3: Life Characteristics and Electrode Thickness Expansion Characteristics of Lithium Secondary Battery The lithium secondary batteries (coin-type half cells) prepared in Examples 4 to 6 and Comparative Examples 4 to 6 were charged at a constant current (CC) of 0.1 C to a voltage of 5 mV under constant current/constant voltage (CC/CV) conditions and then charged at a constant voltage (CV) until the current reached 0.005 C to measure charge capacities in the first cycle. Thereafter, after the lithium secondary batteries were left standing for 20 minutes, the lithium secondary batteries were subsequently discharged at a constant current of 0.1 C to a voltage of 1.5 V to measure initial efficiencies and discharge capacities. Thereafter, after the lithium secondary batteries were left standing for 20 minutes, a cycle, in which the lithium secondary batteries were charged at 0.5 C within the same voltage range under constant current/constant voltage (CC/CV) conditions and then discharged at a constant current of 0.5 C, was repeated 50 times to measure life characteristics. After the cycle was repeated 50 times, the coin-type lithium secondary batteries were again charged at 0.5 C and were disassembled to measure negative electrode thickness expansion rates in a fully charged state. The results of the life characteristics and electrode thickness expansion are presented in Table 3 below.

Life characteristics (%): discharge capacity in a 50th cycle÷discharge capacity in the first cycle×100

Electrode thickness expansion rate (%): (thickness of charged negative electrode in a 51th cycle−initial negative electrode thickness before battery assembly)÷(initial negative electrode thickness before battery assembly−current collector thickness)×100

TABLE 3

|  | Life characteristics (%) | Electrode thickness expansion rate (%) |
|---|---|---|
| Example 4 | 81 | 301 |
| Example 5 | 82 | 312 |
| Example 6 | 95 | 81 |
| Comparative Example 4 | 73 | 353 |
| Comparative Example 5 | 73 | 349 |
| Comparative Example 6 | 89 | 95 |

As illustrated in Table 3, it may be confirmed that, with respect to the secondary battery of Example 4 of the present invention, life characteristics were improved by about 8% in comparison to life characteristics of the secondary battery of Comparative Example 4. Also, it may be confirmed that, with respect to the secondary battery of Example 5 of the present invention, life characteristics were improved by about 9% in comparison to life characteristics of the secondary battery of Comparative Example 5. Furthermore, it may be confirmed that, with respect to the secondary battery of Example 6 of the present invention, life characteristics were improved by about 6% in comparison to life characteristics of the secondary battery of Comparative Example 6.

Also, it may be confirmed that electrode thickness expansion rates of the secondary batteries of Examples 4 to 6 in a charged state in the 51th cycle were significantly lower than those of the secondary batteries of Comparative Examples 4 to 6, respectively.

With, respect to the secondary batteries of Examples 4 and 5, since the amounts of the amorphous silicon particles 1 and 11 in the negative electrode active materials were respectively larger than that of the secondary battery of Comparative Example 6, it was confirmed that the life characteristics were low and the electrode thickness expansion rates were high. That is, since the secondary battery of Comparative Example 6 included the negative electrode active material including the silicon particles and the crystalline carbon, the secondary battery of Comparative Example 6 had higher life characteristics and lower electrode thickness expansion rate than the secondary batteries of Examples 4 and 5.

The invention claimed is:

1. A method of preparing a negative electrode active material for a lithium secondary battery, the method comprising steps of:
depositing an amorphous silicon layer on a surface of a glass substrate by applying silane gas at a rate of 10 sccm/60 min to 50 sccm/60 min in a temperature range of 500° C. to 700° C. and in a pressure range of $10^{-8}$ Torr to 760 Torr (S1) through chemical vapor deposition (CVD) using silane ($SiH_4$) gas as a source (S1);
immersing the glass substrate having the amorphous silicon layer deposited thereon in an acetone solution and then performing ultrasonic milling of the amorphous silicon layer at a power of 50 W to 200 W for 10 minutes to 20 minutes at room temperature using an ultrasonic milling machine to prepare amorphous silicon particles (S2);
dispersing the amorphous silicon particles in a carbon-based precursor solution to prepare a dispersion solution (S3);
spray drying the dispersion solution to prepare a silicon-based composite precursor (S4); and
heat treating the silicon-based composite precursor to form a silicon composite which includes an amorphous carbon coating layer containing at least one amorphous silicon particle in inside thereof (S5).

2. The method of claim 1, wherein a thickness of the deposited amorphous silicon layer is in a range of 20 nm to 500 nm.

3. The method of claim 1, wherein the method further comprises collecting the milled amorphous silicon particles by volatilizing an acetone solvent, after the amorphous silicon particle preparing step S2 and before the dispersion solution preparing step S3.

4. The method of claim 1, wherein the milled amorphous silicon particles have an average particle diameter (D50) of 5 nm to 500 nm.

5. The method of claim 1, wherein the dispersion solution preparing step S3 is performed by mixing a carbon-based material capable of being carbonized at a temperature of 1,000° C. or less with distilled water to prepare the carbon-based precursor solution, and dispersing the amorphous silicon particles.

6. The method of claim 5, wherein the carbon-based material comprises a single material selected from the group consisting of sucrose, glucose, fructose, galactose, maltose, and lactose, or a mixture of two or more thereof.

7. The method of claim 1, wherein the carbon-based precursor solution is used in an amount of 25 parts by weight to 4,000 parts by weight based on 100 parts by weight of the amorphous silicon particles.

8. The method of claim 1, wherein at least one conductive carbon-based material selected from the group consisting of crystalline carbon and amorphous carbon is additionally dispersed during the dispersing of the amorphous silicon particles.

9. The method of claim 1, wherein the dispersion solution spray-drying step S4 is performed by providing the precursor solution to a sprayer to form droplets by spraying, followed by drying the droplets at a same time.

10. The method of claim 1, wherein the spray drying is performed at a rate of 10 mL/min to 50 mL/min in a temperature range of 50° C. to 300° C.

11. The method of claim 1, wherein the silicon-based composite precursor heat treating step S5 is performed in a temperature range of 400° C. to 1,000° C. for about 10 minutes to about 1 hour.

12. A negative electrode active material for a lithium secondary battery prepared by the method of claim 1, the negative electrode active material comprising a silicon composite including:
an amorphous carbon coating layer; and
at least one amorphous silicon particle included in the amorphous carbon coating layer;
wherein the amorphous silicon particles are included in an amount of 1 wt % to 95 wt % based on a total weight of the negative electrode active material;
wherein a weight ratio of the amorphous silicon particles: the amorphous carbon coating layer is in a range of 1:99 to 95:5.

13. The negative electrode active material for a lithium secondary battery of claim 12, wherein the amorphous silicon particle comprises a single particle or a secondary amorphous silicon particle which is formed by agglomeration of primary amorphous silicon particles composed of the single particle.

14. The negative electrode active material for a lithium secondary battery of claim 12 wherein the negative electrode active material further comprises at least one conductive carbon-based material selected from the group consisting of crystalline carbon and amorphous carbon in the amorphous carbon coating layer.

15. The negative electrode active material for a lithium secondary battery of claim 14, wherein the negative electrode active material comprises a silicon composite which includes an amorphous carbon coating, layer; and at least one amorphous silicon particle and amorphous carbon included in the amorphous carbon coating layer.

16. The negative electrode active material for a lithium secondary battery of claim 15, wherein the amorphous carbon is included in an amount of 0.1 wt % to 50 wt % based on a total weight of the negative electrode active material.

17. The negative electrode active material for a lithium secondary battery of claim 14, wherein the negative electrode active material comprises an amorphous carbon coating layer; and at least one amorphous silicon particle and crystalline carbon included in the amorphous carbon coating layer,
- wherein the at least one amorphous silicon particle is distributed on a surface of the crystalline carbon;
- wherein the crystalline carbon has an average particle diameter (D50) of 300 nm to 30 μm and is included in an amount of 10 wt % to 90 wt % based on a total weight of the negative electrode active material.

18. A negative electrode comprising:
- a current collector; and
- the negative electrode active material of claim 12 which is formed on at least one surface of the current collector.

* * * * *